(12) United States Patent
Van Beek et al.

(10) Patent No.: US 7,315,346 B2
(45) Date of Patent: Jan. 1, 2008

(54) LITHOGRAPHIC APPARATUS AND DEVICE MANUFACTURING METHOD

(75) Inventors: Michael Cornelis Van Beek, Eindhoven (NL); Levinus Pieter Bakker, Helmond (NL); Theodorus Hubertus Josephus Bisschops, Eindhoven (NL); Jeroen Jonkers, Aachen (DE); Mark Kroon, Utrecht (NL); Robertus Adrianus Maria Wolters, Eindhoven (NL); Adrianus Johannes Henricus Maas, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/733,771

(22) Filed: Dec. 12, 2003

(65) Prior Publication Data
US 2004/0165160 A1    Aug. 26, 2004

(30) Foreign Application Priority Data
Dec. 13, 2002  (EP) .................................. 02258605

(51) Int. Cl.
*G03B 27/52* (2006.01)
*G03B 27/42* (2006.01)
*G03B 27/54* (2006.01)
*G03B 27/32* (2006.01)

(52) U.S. Cl. ............................ 355/30; 355/53; 355/67; 355/77

(58) Field of Classification Search .................. 134/1.1, 134/39; 250/428, 281; 216/59; 355/53, 355/30, 67; 430/125
See application file for complete search history.

(56) References Cited

U.S. PATENT DOCUMENTS

| 5,099,557 | A | * | 3/1992 | Engelsberg ................. 29/25.01 |
| 5,229,872 | A | | 7/1993 | Mumola |
| 5,296,891 | A | | 3/1994 | Vogt et al. |
| 5,308,791 | A | * | 5/1994 | Horiike et al. .............. 438/758 |
| 5,312,519 | A | * | 5/1994 | Sakai et al. .................. 134/1.1 |
| 5,466,942 | A | * | 11/1995 | Sakai et al. ............... 250/492.2 |
| 5,523,193 | A | | 6/1996 | Nelson |
| 5,539,211 | A | * | 7/1996 | Ohtoshi et al. ......... 250/441.11 |
| 5,969,441 | A | | 10/1999 | Loopstra et al. |
| 5,981,960 | A | * | 11/1999 | Ooaeh et al. ............. 250/492.2 |
| 6,046,792 | A | | 4/2000 | Van Der Werf et al. |
| 6,105,589 | A | * | 8/2000 | Vane .......................... 134/1.1 |
| 6,385,290 | B1 | | 5/2002 | Kondo et al. |
| 6,427,703 | B1 | * | 8/2002 | Somekh ...................... 134/1.1 |
| 6,614,505 | B2 | * | 9/2003 | Koster et al. .................. 355/30 |

(Continued)

FOREIGN PATENT DOCUMENTS
EP    0 874 283 A2    10/1998

(Continued)

*Primary Examiner*—Alan Mathews
(74) *Attorney, Agent, or Firm*—Pillsbury Winthrop Shaw Pittman LLP

(57) ABSTRACT

A lithographic projection apparatus is disclosed. The apparatus includes a support structure constructed to support a patterning structure. The patterning structure is adapted to pattern a beam of radiation according to a desired pattern. The apparatus also includes a substrate holder that is constructed to hold a substrate, a projection system that is constructed and arranged to project the patterned beam onto a target portion of the substrate, and a downstream radical source that is connected to a gas supply and is configured to provide a beam of radicals onto a surface to be cleaned.

20 Claims, 5 Drawing Sheets

U.S. PATENT DOCUMENTS 6,968,850 B2    11/2005  Chan et al.
2001/0028447 A1*  10/2001  Hase et al. .................... 355/53
2001/0036741 A1*  11/2001  Tanaka et al. .............. 438/710
2001/0055104 A1*  12/2001  Irie ............................. 355/53

FOREIGN PATENT DOCUMENTS

| | | |
|---|---|---|
| JP | 10-289854 | 10/1998 |
| JP | 2000-90868 | 3/2000 |
| WO | WO98/33096 | 7/1998 |
| WO | WO98/38597 | 9/1998 |
| WO | WO98/40791 | 9/1998 |

\* cited by examiner

LITHOGRAPHIC APPARATUS AND DEVICE MANUFACTURING METHOD

CROSS-REFERENCE TO RELATED APPLICATIONS

This application is based on and claims priority from European Patent Application No. 02258605.1 filed on Dec. 13, 2002, the contents of which are incorporated herein by reference.

BACKGROUND OF THE INVENTION

1. Field of the Invention

The present invention relates generally to the field of lithography. More specifically, the present invention relates to cleaning surfaces in a lithographic projection apparatus.

2. Description of the Related Art

The term "patterning device" or "patterning structure" as here employed should be broadly interpreted as referring to a device or structure that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning means include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The matrix addressing can be performed using suitable electronic means. In both of the situations described hereabove, the patterning means can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as needed.

A programmable LCD array. An example of such a construction is given in U.S. Pat. No. 5,229,872, which is incorporated herein by reference. As above, the support structure in this case may be embodied as a frame or table, for example, which may be fixed or movable as needed.

For purposes of simplicity, the rest of this text may, at certain locations, specifically direct itself to examples involving a mask and mask table; however, the general principles discussed in such instances should be seen in the broader context of the patterning means as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step and scan apparatus—each target portion is irradiated by progressively scanning the mask pattern under the projection beam in a given reference direction (the "scanning" direction) while synchronously scanning the substrate table parallel or anti parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo mechanical polishing, etc., all intended to finish off an individual layer. If several layers are desired, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0 07 067250 4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

Contamination on the surface of elements, such as optical elements like reflectors, lenses, deflectors, sensors or the patterning structure, degrades the performance of the apparatus. This is especially true for apparatus employing EUV radiation, which is especially sensitive to intensity loss, but is also a problem for Deep UV (DUV), electron (EPL) and ion projection lithography (IPL). Contamination may, for example, follow from hydrocarbon contaminants in the apparatus being deposited on the surfaces. Radiation (especially EUV radiation) incident on the surface breaks the bonds of the hydrocarbons to form chemical bonds between carbon atoms from the hydrocarbons and the surface, leaving an amorphous carbon layer. The hydrocarbons themselves can also degrade the performance of the apparatus. Other contaminants include $O_2$ and $H_2O$ and crystals of refractory compounds, including those that contain sulfates, phosphates or silanes. An amorphous carbon layer, for example, absorbs a significant fraction of the EUV radiation subsequently incident on an optical surface (approximately 1% in a 1 nm thick layer, for example). Therefore, for an apparatus with ten reflectors, (which even when perfectly clean, are not efficient reflectors), each with an amorphous carbon layer formed on its surface, the intensity of the EUV beam at the substrate will be reduced by a further 10%. This in turn increases the exposure time for each substrate and reduces the throughput of the apparatus.

For sensors, the absorption of the EUV radiation prohibits calibrated dose measurements and reduces the signal-to-noise ratio. Sensors are needed to accurately measure the intensity of EUV radiation in an EUV apparatus in order to ensure that the appropriate exposure dose is provided to a substrate. It is therefore necessary for the contamination to be removed without damaging the sensitive diode.

Under the normal conditions of an EUV apparatus, the carbon growth rate is approximately 1-10 nm/hr. Therefore, the optical elements, for example, require regular cleaning. For the cleaning to be practical, it should be performed in-situ, be completed quickly, and should not damage the optical surface.

A presently known method of removing the carbon contamination combines UV radiation and ozone to react with the carbon to form CO and $CO_2$, which desorb from a surface and are subsequently pumped away. However, for efficient UV/ozone cleaning, a pressure of at least 1 mbar is needed. This is not compatible with an EUV lithographic apparatus in which the pressure is approximately $10^{-7}$ to $10^{-2}$ mbar. Furthermore, the cleaning rate for UV/ozone cleaning is approximately 1 to 10 nm/hr. This is approximately the same as the rate of contamination. Therefore, 50% of the operational time would be needed for cleaning. This loss of throughput is not acceptable in practical terms.

An alternative well-known cleaning method is conventional oxygen plasma cleaning. Again, oxygen radicals react with the carbon to form CO and $CO_2$ molecules which desorb from the surface and can subsequently be pumped away. However, conventional oxygen plasma cleaning is also unsuitable for use in an EUV lithographic apparatus. A pressure of approximately 1 mbar is needed to generate a stable plasma. A plasma is also difficult to confine to a specific region and, if used in a lithographic apparatus, may damage other sensitive elements of the apparatus such as the electronics and cables.

SUMMARY OF EMBODIMENTS OF THE INVENTION

It is an aspect of embodiments of the present invention to provide a method of cleaning surfaces in a lithographic projection apparatus that overcomes the disadvantages described above.

This and other aspects may be achieved according to an embodiment of the invention in which a lithographic apparatus includes a radiation system for supplying a projection beam of radiation, a support structure for supporting a patterning device, the patterning device serving to pattern the projection beam according to a desired pattern, a substrate table for holding a substrate, and a projection system for projecting the patterned beam onto a target portion of the substrate. The apparatus further includes a downstream radical source, connected to a gas supply, that provides a beam of radicals, and a structure that directs the beam of radicals onto a surface to be cleaned.

Another embodiment is directed to a lithographic apparatus that includes a support structure constructed to support a patterning structure. The patterning structure is adapted to pattern a beam of radiation according to a desired pattern. The apparatus also includes a substrate holder that is constructed to hold a substrate, a projection system that is constructed and arranged to project the patterned beam onto a target portion of the substrate, and a downstream radical source that is connected to a gas supply and is configured to provide a beam of radicals onto a surface to be cleaned.

A further embodiment is directed to a lithographic apparatus that includes a radiation source that provides a beam of radiation, and a support structure that is constructed to support a patterning structure. The patterning structure is adapted to pattern the beam of radiation according to a desired pattern. The apparatus also includes a substrate holder that is constructed to hold a substrate, a projection system that is constructed and arranged to project the patterned beam onto a target portion of the substrate, a radical source connected to a gas supply and configured to provide a localized beam of radicals, and a structure to direct the beam of radicals onto a surface to be cleaned. The radical source is disposed away from the radiation source such that operating conditions of the radical source do not adversely affect the beam of radiation.

Such apparatus can quickly and effectively remove contamination. Furthermore, because the volume where the radicals are formed is separated from the rest of the lithographic tool, the conditions in this region can be optimized without affecting the remainder of the apparatus. For example, the downstream radical source may provide a local region of high pressure to sustain a stable plasma to produce the radicals without needing the pressure within the remainder of the lithographic apparatus to be raised above the normal operating pressure of $10^{-7}$ to $10^{-2}$ mbar. Additionally, the radical source may be located away from a lithographic apparatus in which very little space is available.

In order to reduce the risk of damage to a surface, preferably the beam of radicals contains substantially no ionized particles. This is achieved by the ionized particles produced in the radical source being neutralized by collisions with the walls of the downstream radical source and/or a Faraday grid at the orifice of the downstream radical source. Most of the neutral radicals survive such collisions and exit the downstream radical source to react with the contaminant.

The gas supply may supply one of oxygen, hydrogen, and fluorine such that the downstream radical source produces oxygen, hydrogen, or fluorine radicals. Different radicals may be used to remove different contaminants. For example, oxygen radicals may be used to remove amorphous carbon, hydrocarbon molecules, and polymerized hydrocarbons, whereas oxides may be removed with hydrogen or fluorine radicals.

An optical surface to be cleaned may be one of the patterning structure, a sensor, a lens, a deflector, and a reflector for reflecting one of the projection beam and the patterned beam. Contamination on any one of these surfaces will reduce the efficiency and/or the accuracy of the apparatus.

The position of the downstream radical source may be fixed. In this case, the structure for directing the beam of radicals onto the surfaces to be cleaned will incorporate a structure for moving the component containing the surface to be cleaned, such that the beam of radicals is incident on the surface. Many of the components that require cleaning should, in any case, be movable within the apparatus. Consequently, this arrangement will be simpler than providing a structure for moving the downstream radical source to the components to be cleaned. Alternatively, or additionally, the downstream radical source may be moved to and/or over the surfaces to be cleaned.

Especially in the case of an apparatus employing EUV radiation, the apparatus may comprise an evacuated chamber containing the patterning structure, the substrate, and the projection system. The evacuated chamber may also contain the end of a tube which is part of the downstream radical source and from which the beam of radicals is discharged. The remainder of the downstream radical source, including an RF coil or a microwave or RF cavity that generates a region of plasma within the tube and through which gas from the gas supply flows to produce the radicals may be located outside of the evacuated chamber. This reduces the number of components that should be made vacuum compatible and reduces the size of the evacuated chamber. This in turn minimizes the cost of the apparatus. The radicals may also be formed, for example, by the provision of a high temperature element in the flow of gas. The high temperature element should be hot enough to cause thermal dissociations. As with the RF coil or a microwave or RF cavity, the high temperature element may be provided outside the evacuated chamber.

Where several surfaces should be cleaned or the surface to be cleaned is large, the apparatus may comprise two or more downstream radical sources and corresponding beams of radicals that may simultaneously be generated, reducing the total cleaning time and increasing the throughput of the apparatus.

According to a further aspect of the invention there is provided a device manufacturing method including providing a substrate that is at least partially covered by a layer of radiation-sensitive material, providing a projection beam of radiation using a radiation system, using a patterning structure to endow the projection beam with a pattern in its cross-section, projecting the patterned beam of radiation onto a target portion of the layer of radiation-sensitive material, characterized by providing a flow of gas in a downstream radical source to produce a beam of radicals, and directing said beam of radicals onto a surface to be cleaned.

In at least one embodiment, the downstream radical source may include a tube that is connected to the gas supply at one end, and includes an orifice at an opposite end, and a plasma generator that is configured to generate a plasma region. Gas from the gas supply may flow through the tube and through the plasma region such that neutral and ionized particles are created. The beam of radicals exits the tube at the orifice onto the surface to be cleaned.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

DETAILED DESCRIPTION OF EMBODIMENTS OF THE INVENTION

Embodiment 1

Figure 1:
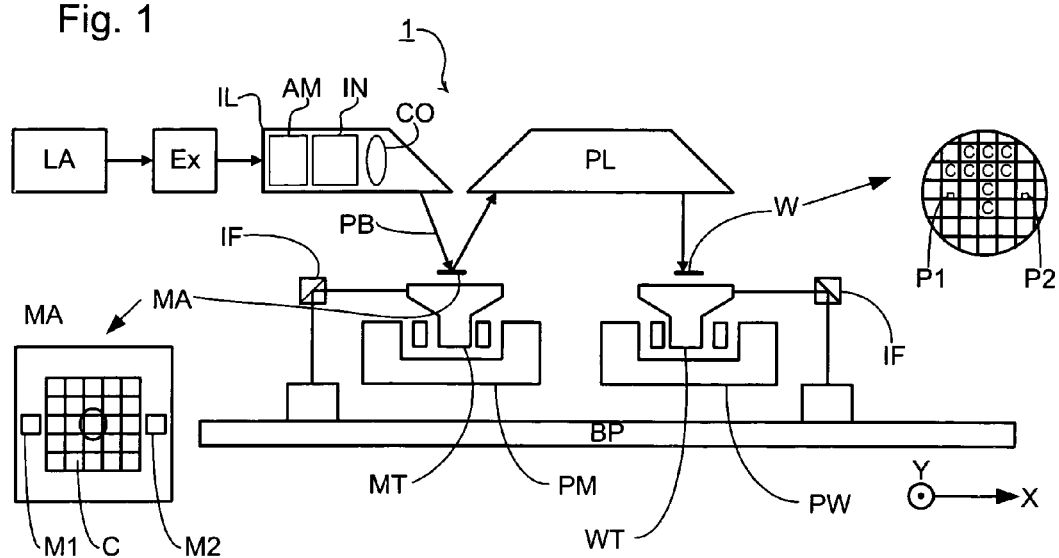
FIG. 1 depicts a lithographic projection apparatus according to an embodiment of the invention.

FIG. 1 schematically depicts a lithographic projection apparatus 1 according to particular embodiments of the invention. The apparatus 1 may comprise a radiation system Ex, IL, for supplying a projection beam PB of radiation (e.g. EUV radiation), which in this particular case also comprises a radiation source LA; a first object table (mask table) MT provided with a mask holder for holding a mask MA (e.g. a reticle), and connected to a first positioning device for accurately positioning the mask with respect to item PL; a second object table (substrate table) WT provided with a substrate holder for holding a substrate W (e.g. a resist coated silicon wafer), and connected to a second positioning device for accurately positioning the substrate with respect to item PL; and a projection system ("lens") PL (e.g. mirror group) for imaging an irradiated portion of the mask MA onto a target portion C (e.g. comprising one or more dies) of the substrate W. The term table as used herein can also be considered or termed as a support. It should be understood that the term support or table broadly refers to a structure that supports, holds, or carries a substrate.

As here depicted, the apparatus is of a reflective type (e.g. has a reflective mask). However, in general, it may also be of a transmissive type, for example (e.g. with a transmissive mask). Alternatively, the apparatus may employ another kind of patterning means, such as a programmable mirror array of a type as referred to above.

The source LA (e.g. a laser-produced or discharge plasma source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. Embodiments of the present invention and the claims attached hereto encompass at least both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning device (and interferometric measuring means IF), the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and
2. In scan mode, essentially the same scenario applies, except that a given target portion C is not exposed in a single "flash". Instead, the mask table MT is movable in a given direction (the so called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, $M=\frac{1}{4}$ or $\frac{1}{5}$). In this manner, a relatively large target portion C can be exposed, without having to compromise on resolution.

Figure 2:
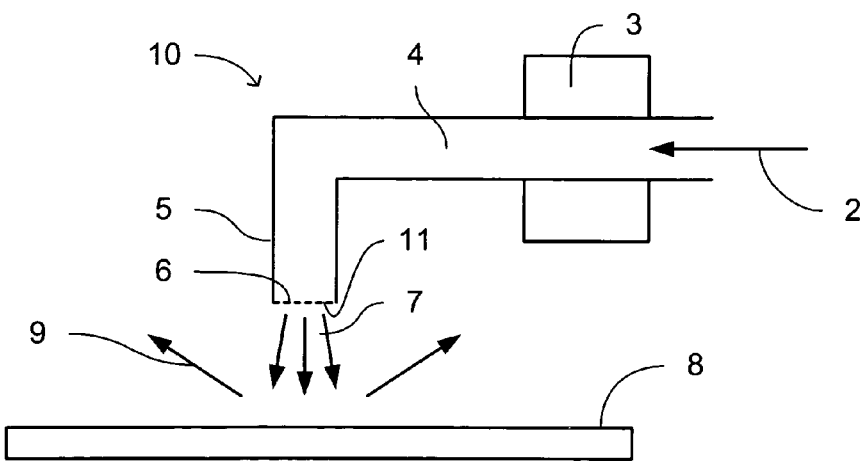
FIG. 2 depicts a downstream radical source according to an embodiment of the present invention.

FIG. 2 shows a downstream radical source 10 of an embodiment of the present invention. As understood by one of ordinary skill in the art, the downstream radical source 10 is disposed downstream of, or away from, the radiation source LA. This allows the radical source 10 to be operated at conditions necessary to effectively clean a target surface without affecting the beam of radiation PB that is generated by the radiation source LA. A flow of oxygen 2 or other gas, such as hydrogen or fluorine, is provided to flow through a tube 4. The oxygen flows through a plasma region 3 which may be generated, for example, by an RF coil or a microwave or RF cavity. Other means of generating the plasma region will also be suitable. Alternatively, the radicals may be created in a continuous or burst mode DC discharge. In the plasma region 3, neutral and ionized active particles are generated. The ionized particles may be neutralized by collisions with the tube walls 5 or with a Faraday grid 6 that may be located at, for example, the tube orifice. The neutral radicals, which will react with a contaminant, such as carbon, but will not damage the surface, survive these collisions and exit the tube as beam 7. The neutral radicals react with, for example, a carbon contaminant on the optical surface 8 to form CO and $CO_2$ 9 which desorb from the surface and disperse into the lithographic apparatus. In the case of apparatus employing EUV radiation, the CO and $CO_2$ gases are subsequently extracted by a vacuum system.

Although it is desirable to remove the ionized particles from the beam 7 to reduce the likelihood of damage to the surface 8, it will be appreciated that the present invention can be performed with a beam 7 that contains ionized particles. In any case, the Faraday grid 6 is not an essential feature of the invention and, where appropriate, the ionized particles may be removed by other means.

Figure 3:
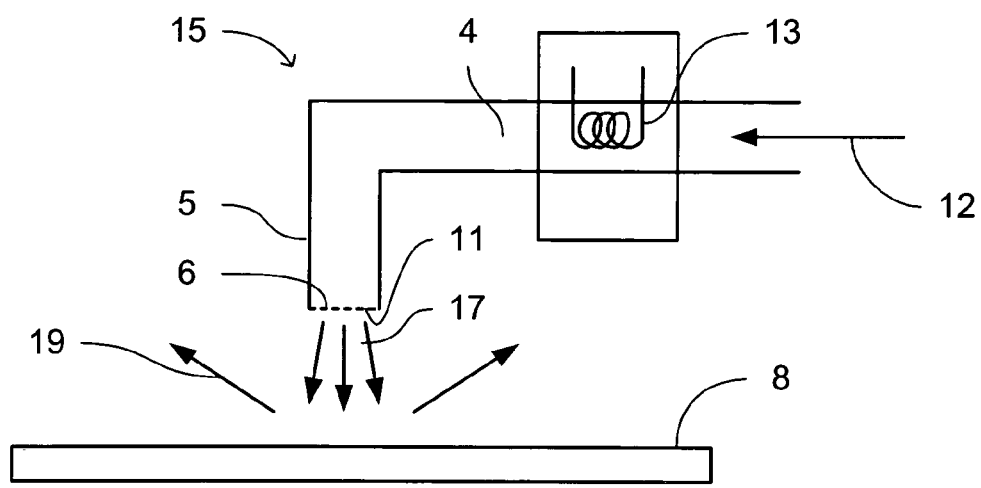
FIG. 3 depicts a variant of the downstream radical source shown in FIG. 2.

FIG. 3 shows a variant 15 of the apparatus shown in FIG. 2. In this case, the radicals are generated by a high temperature element 13 such as a glowing wire. The heating element should be at a high enough temperature, for example, about 1700° C., for efficient thermal dissociation. This apparatus and method is especially useful for generating a beam of hydrogen radicals 17 from a flow of hydrogen gas 12. Hydrogen radicals are especially useful for removing oxides, in which case, the radicals react to form $H_2O$.

Referring back to FIG. 2, the downstream radical source 10 may be fixed within the lithographic apparatus and the elements requiring cleaning will be moved to be within the path of the beam 7 of neutral radicals. Depending on the size of the area to be cleaned, the optical element may be scanned repeatedly under the beam 7. Entire surfaces of the optical element may be cleaned or, alternatively, the surfaces may be pre-scanned to determine which specific areas require cleaning and then these areas scanned under the beam 7. Alternatively, the lithographic apparatus may have a downstream radical source that can be moved to a surface that requires cleaning and/or moved to scan the beam of radicals over a surface to be cleaned. A combination of both systems may also be used.

In a preferred embodiment, only the end of the tube 5 of the downstream radical source that incorporates the opening 11 from which the beam 7 of radicals is discharged will be located in the evacuated chamber containing the elements to be cleaned (e.g. in the case of apparatus using EUV radiation). However, where appropriate, the entirety of the downstream radical source 10 may be contained within the evacuated chamber.

During normal use of an EUV lithographic apparatus, the surfaces of the sensors on the wafer stage will require cleaning approximately every 10 minutes. The time taken to clean the sensors will be less than about one minute. Therefore, the reduction in throughput due to this form of cleaning will be within acceptable limits. The cleaning cycle of other elements will be comparable or better.

Although the above description has only specified a single downstream radical source within an apparatus, it will be appreciated that the total cleaning time needed may be reduced by providing two or more downstream radical sources within the apparatus.

Figure 4:
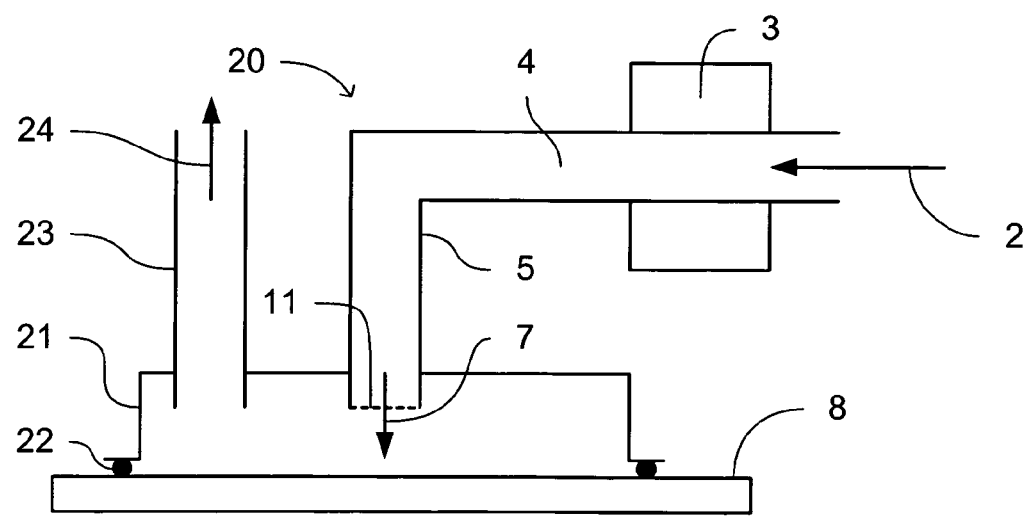
FIG. 4 depicts a further variant of the downstream radical source shown in FIG. 2.

FIG. 4 shows a downstream radical source 20 which is a further variant of that shown in FIG. 2. In this case a hood 21 is attached to the end of the tube 5 to minimize the flow of gas into the remainder of the apparatus. This is especially useful for apparatus using EUV radiation, in which the patterning means, the projection system and the substrate may be within an evacuated chamber. A seal 22 is provided around the edge of the hood 21 that is in contact with the surface 8 to be cleaned. A second tube 23 attached to the hood 21 is used to exhaust the gases 24, such as CO and $CO_2$, from the hood. This apparatus can, for example, also be used in a chamber that is at a higher pressure in which case the hood 21 can be used to create a region of lower pressure for the downstream radical source to operate in.

Figure 5:
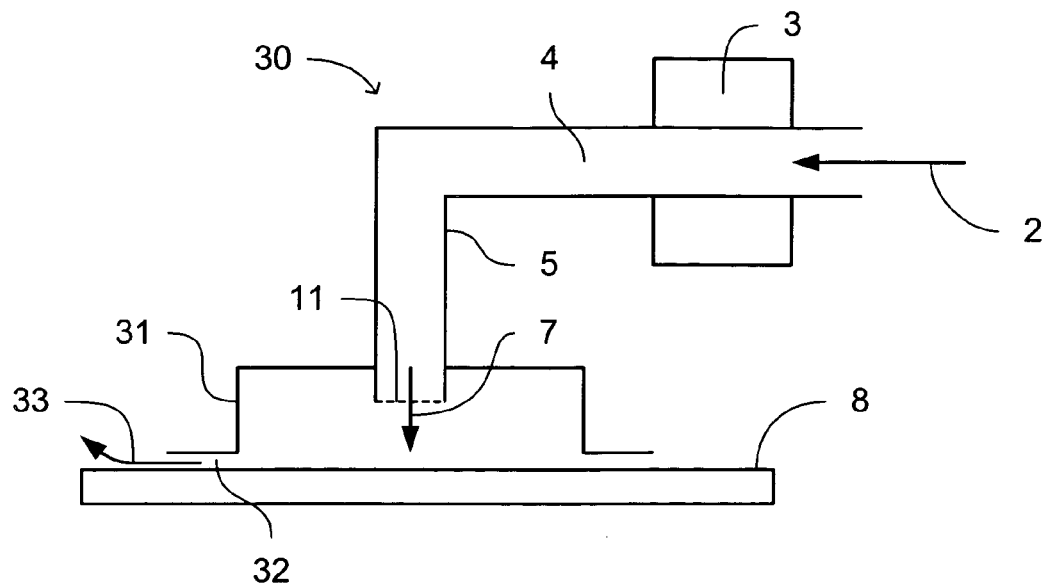
FIG. 5 depicts a further variant of the downstream radical source shown in FIG. 2.

FIG. 5 shows a further variant 30 of the downstream radical source of the present invention. Again a hood 31 is attached to the end of the tube 5 of the downstream radical source. In many cases the surface 8 of the element to be cleaned will be too sensitive to have contact with the hood 31. Therefore, the hood 31 is closely positioned adjacent to the surface 8, leaving a small, controlled, gap 32 between the edge of the hood 31 and the surface 8. The gap can be accurately servo-controlled, for example, by using capacitor sensors. Gas 33, such as CO and $CO_2$, will flow from within the hood 31 into the evacuated chamber. However, because the gas will flow through a restricted space, the pressure within the hood 31 will be greater than that in the evacuated chamber. This will assist in maintaining sufficient pressure within the downstream plasma radical source to form a stable plasma region 3, for example.

Figure 6:
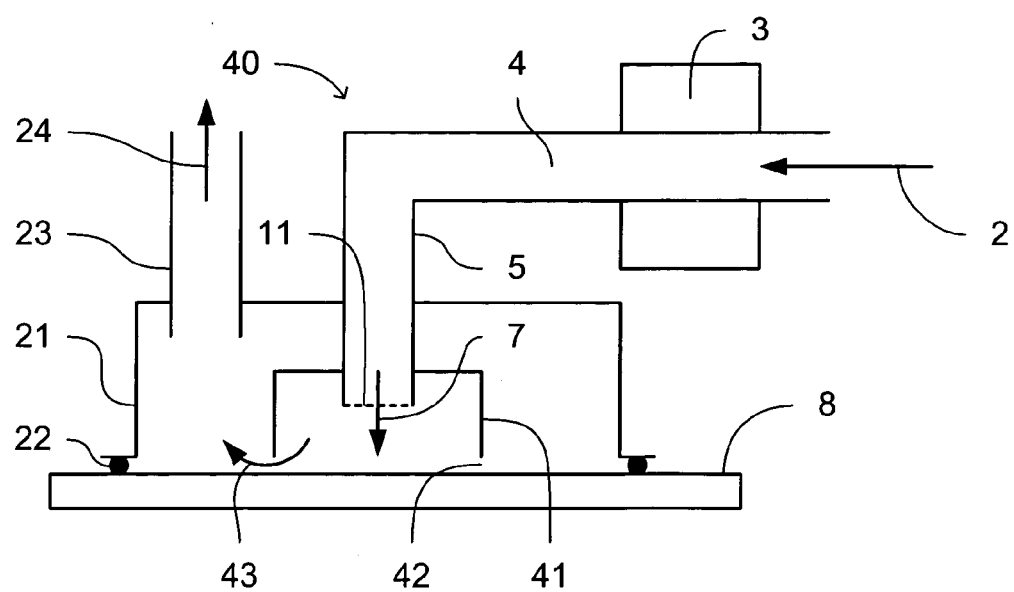
FIG. 6 depicts a variant of the downstream radical source shown in FIG. 4.

FIG. 6 shows a further variant of the invention. As with the variant shown in FIG. 4, the downstream radical source 40 has a hood 21 that connects to the surface 8 to be cleaned by means of a seal 22 to minimize the flow of gas from the hood 21 into the evacuated chamber. A second hood 41 is provided within the first hood 21. A narrow gap 42 is left between the second hood 41 and the surface 8 to be cleaned. The gas 43, such as CO and $CO_2$, flows through this narrow gap 42 into the space between the first and second hoods 21, 41. This establishes a pressure difference between the inside of the second hood 41 and the space between the first hood and the second hood. This in turn increases the pressure difference between the evacuated chamber and the gas in the tube 5 which facilitates the formation of a stable plasma region 3.

Figure 7:
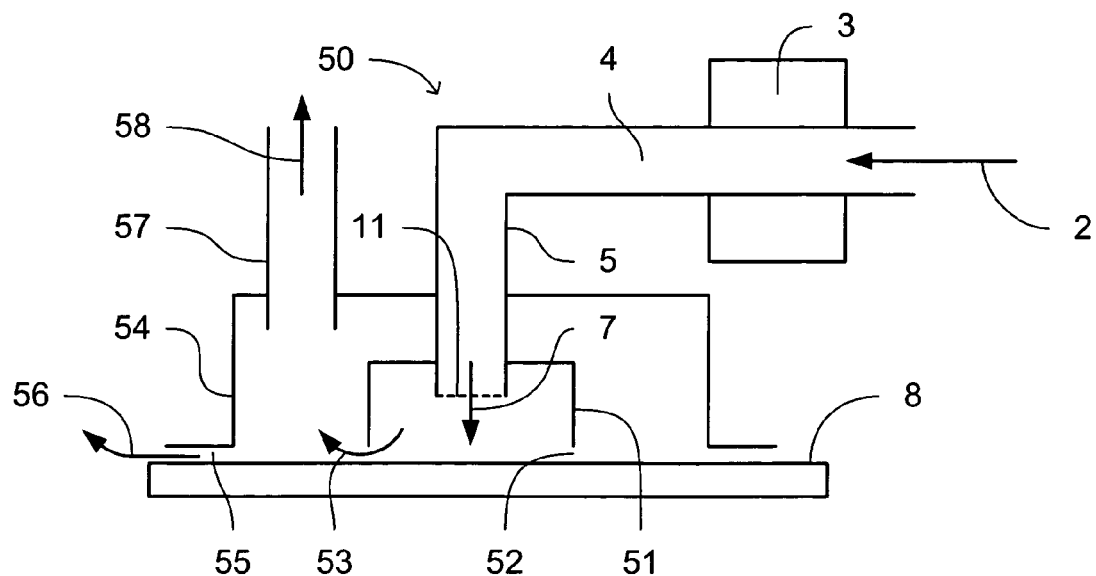
FIG. 7 depicts a variant of the downstream radical source shown in FIG. 5.

FIG. 7 shows a further variant 50 of the present invention, combining the features of the variants shown in FIGS. 5 and 6. A first hood 54 is provided to minimize the flow of gas 56, such as CO and $CO_2$, into the evacuated chamber but is not in physical contact with the surface 8 to be cleaned. As in the variant shown in FIG. 4, the gap 55 between the first hood 54 and the surface 8 to be cleaned is very small and a second tube 57 is provided to exhaust the gas 58, such as CO and $CO_2$. A second hood 51 attached to the end of the tube 5 has a small gap between it and the surface 8 to restrict the flow of gas 53, such as CO and $CO_2$, into the space between the first and second hoods 54, 51. This variant combines the features of minimizing the flow of gas into the evacuated chamber whilst maintaining a high pressure in the tube 5 to assist in forming a stable plasma region 3, without being in physical contact with the surface 8 to be cleaned.

Figure 8:
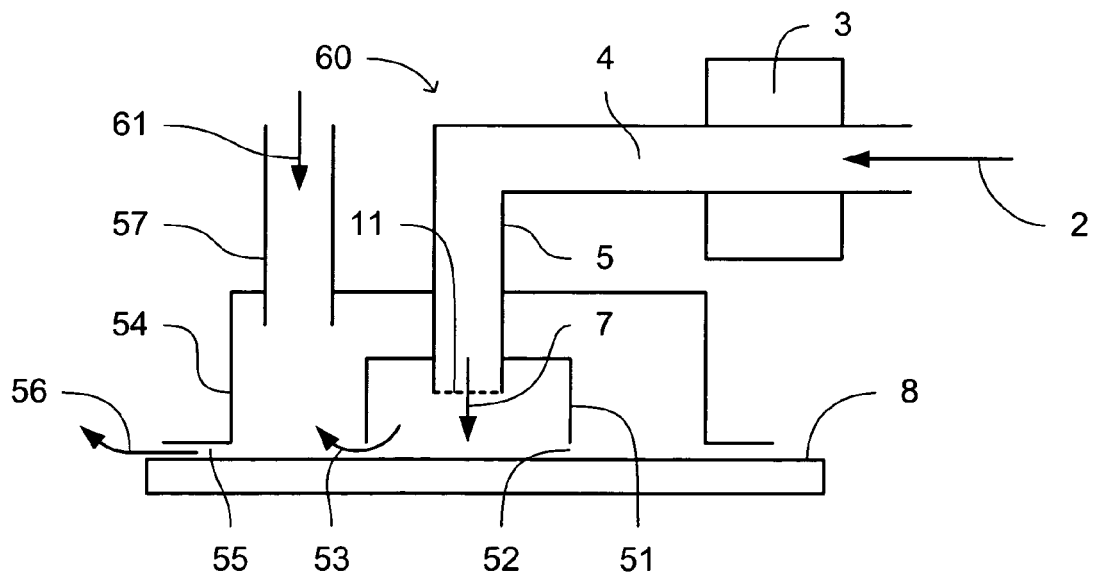
FIG. 8 depicts a variant of the downstream radical source shown in FIG. 7.

FIG. 8 shows a further variant of the invention. The downstream radical source 60 has the same arrangement as that shown in FIG. 7 but the second tube 57 is used to provide an inward flow of gas 61, such as N2, into the first hood 54 instead of extracting gas, such as CO and $CO_2$. For example, N2 gas reacts with any remaining oxygen ions in the beam 7 to further reduce the likelihood of ions damaging the surface 8 being cleaned. Other neutralizing gases could be used in place of the N2 gas.

Figure 9:
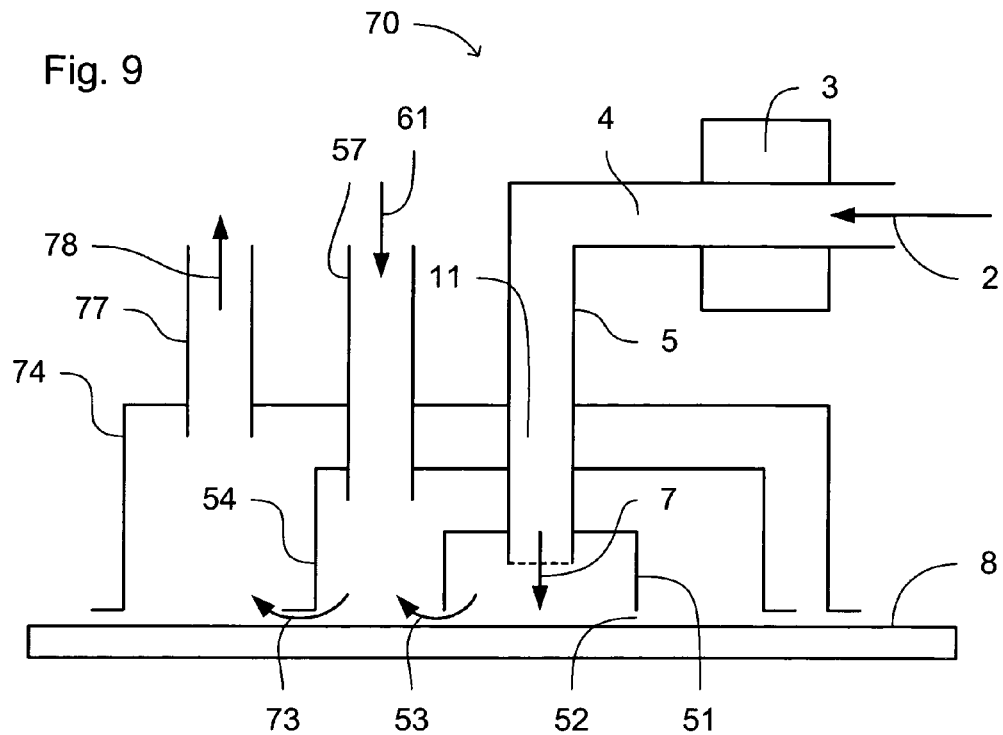
FIG. 9 depicts a variant of the downstream radical source shown in FIG. 8.

FIG. 9 shows a further variant 70 of the invention. The downstream radical source 70 has the same arrangement shown in FIG. 8 but a third hood 74 is provided to extract the gas 73 flowing out of the first hood 54. The gas 78 is extracted by means of a third tube 77. This has the advantage of minimizing the load on the system evacuating the main chamber.

It will be appreciated that the variants described with reference to FIGS. 4 to 9 may also be used with other radical sources and other cleaning techniques such as ozone cleaning and oxygen plasma.

While specific embodiments of the invention have been described above, it will be appreciated that the invention may be practiced otherwise than as described. The description is not intended to limit the invention.

What is claimed is:
1. A lithographic projection apparatus comprising:
  a support structure constructed to support a patterning device, said patterning device being configured to pattern a beam of radiation according to a desired pattern;
  a substrate holder constructed to hold a substrate;
  a projection system constructed and arranged to project the patterned beam onto a target portion of the substrate; and a downstream radical source having a tube connected to a gas supply and configured to provide a beam of radicals directed onto a surface of a component to be cleaned, wherein the radicals are generated within a flow of gas from the gas supply in the tube, and wherein the tube of the radical source is constructed and arranged to be moved relative to the surface to be cleaned and/or the component is constructed and arranged to be moved relative to the tube of the radical source so that the beam of radicals is incident on the surface to be cleaned.

2. A lithographic projection apparatus according to claim 1, wherein said beam of radicals contains substantially no ionized particles.

3. A lithographic projection apparatus according to claim 1, wherein said gas supply supplies at least one of oxygen, hydrogen, or fluorine.

4. A lithographic projection apparatus according to claim 3, wherein said downstream radial source provides a beam of at least one of oxygen radicals, hydrogen radicals, or fluorine radicals.

5. A lithographic projection apparatus according to claim 1, wherein said surface of the component to be cleaned is on one of the patterning device, a sensor, a lens, a deflector, or a beam reflector.

6. A lithographic projection apparatus according to claim 1, wherein the position of the downstream radical source is fixed.

7. A lithographic projection apparatus according to claim 6, further comprising a structure to direct said beam of radicals onto said surface to be cleaned, said structure comprising a device that moves the component containing said surface such that the beam of radicals is incident on said surface.

8. A lithographic projection apparatus according to claim 1, wherein the downstream radical source comprises one or more of an RF coil, a pair of DC discharge electrodes, a microwave cavity, and an RF cavity that generates a region of plasma within the flow of gas from the gas supply, the radicals being created in said plasma region.

9. A lithographic projection apparatus according to claim 1, wherein the downstream radical source comprises a high temperature element located within the flow of the gas from the gas supply, the temperature of the high temperature element being sufficient to cause thermal dissociation to create the radicals.

10. A lithographic projection apparatus according to claim 1, further comprising:

an evacuated chamber that contains the patterning device, the substrate, and the projection system, wherein the beam of radicals are discharged from an end of said tube, and said end of the tube is located in the evacuated chamber.

11. A lithographic projection apparatus according to claim 10, wherein the region of the downstream radical source in which the radicals are formed is located outside of the evacuated chamber.

12. A lithographic projection apparatus according to claim 1, wherein the apparatus comprises at least two downstream radical sources and corresponding beams of radicals for cleaning said surface.

13. A lithographic projection apparatus according to claim 1, wherein said surface of the component to be cleaned comprises a surface of an optical element.

14. A device manufacturing method comprising:

providing a beam of radiation;

patterning the beam of radiation;

projecting the patterned beam of radiation onto a target portion of a layer of radiation-sensitive material;

providing a flow of gas from a gas supply;

generating a beam of radicals in the flow of gas from the gas supply in a tube of a downstream radical source;

moving the tube of the radical source relative to a component comprising a surface to be cleaned and/or moving the component relative to the tube of the radical source; and directing said beam of radicals onto the surface to be cleaned so that the beam of radicals is incident on the surface to be cleaned.

15. A lithographic projection apparatus comprising:

a radiation source that provides a beam of radiation;

a support structure constructed to support a patterning device, said patterning device being configured to pattern the beam of radiation according to a desired pattern;

a substrate holder constructed to hold a substrate;

a projection system constructed and arranged to project the patterned beam onto a target portion of the substrate;

a radical source connected to a gas supply and configured to generate a localized beam of radicals in a flow of gas from the gas supply in a tube of the radical source; and a structure to direct said beam of radicals onto a surface to be cleaned, wherein said radical source is disposed away from said radiation source such that operating conditions of said radical source do not adversely affect said beam of radiation, and wherein the tube of the radical source is constructed and arranged to be moved relative to a component comprising the surface to be cleaned and/or the component is constructed and arranged to be moved relative to the tube of the radical source so that the localized beam of radicals is incident on the surface to be cleaned.

16. A lithographic projection apparatus according to claim 15, wherein said radical source comprises:

a plasma generator to generate a plasma region, wherein gas from the gas supply flows through the tube and through the plasma region such that neutral and ionized particles are created, and the beam of radicals exits the tube at an orifice onto the surface to be cleaned.

17. A lithographic projection apparatus according to claim 16, wherein walls of the tube neutralize the ionized particles.

18. A lithographic projection apparatus according to claim 16, wherein a Faraday grid neutralizes the ionized particles.

19. A lithographic apparatus according to claim 18, wherein the Faraday grid is disposed at the orifice of the tube.

20. A lithographic apparatus according to claim 15, wherein said surface to be cleaned comprises a surface of an optical element.

* * * * *